United States Patent
Choo et al.

(10) Patent No.: US 7,425,731 B2
(45) Date of Patent: Sep. 16, 2008

(54) LIGHT EMITTING DIODE PACKAGE

(75) Inventors: Ho Sung Choo, Gyunggi-Do (KR);
Youn Gon Park, Gyunggi-Do (KR);
Jong Myeon Lee, Gyunggi-Do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 30 days.

(21) Appl. No.: 11/708,459

(22) Filed: Feb. 21, 2007

(65) Prior Publication Data

US 2007/0194338 A1    Aug. 23, 2007

(30) Foreign Application Priority Data

Feb. 21, 2006    (KR)    ............ 10-2006-0016717

(51) Int. Cl.
*H01L 29/18*    (2006.01)

(52) U.S. Cl. ............................ 257/98; 257/788

(58) Field of Classification Search ............ 257/98, 257/788
See application file for complete search history.

(56) References Cited

U.S. PATENT DOCUMENTS

| | | | |
|---|---|---|---|
| 6,617,400 B2 * | 9/2003 | Yeager et al. | 525/533 |
| 6,809,162 B2 * | 10/2004 | Rubinsztajn | 525/533 |
| 6,841,888 B2 * | 1/2005 | Yan et al. | 257/794 |
| 7,304,425 B2 * | 12/2007 | Ouderkirk et al. | 313/501 |
| 7,314,770 B2 * | 1/2008 | Boardman et al. | 438/30 |

* cited by examiner

*Primary Examiner*—Douglas M Menz
(74) *Attorney, Agent, or Firm*—McDermott Will & Emery LLP

(57) ABSTRACT

A light emitting diode package with reduced light loss includes a package substrate, a light emitting diode chip mounted on the package substrate and an encapsulant formed on the package substrate to encapsulate the light emitting diode chip. The encapsulant has a refractive index gradient with refractive indices continuously increasing from a peripheral surface thereof to a central axis thereof.

13 Claims, 6 Drawing Sheets (a)

(b)

LIGHT EMITTING DIODE PACKAGE

CLAIM OF PRIORITY

This application claims the benefit of Korean Patent Application No. 2006-0016717 filed on Feb. 21, 2006, in the Korean Intellectual Property Office, the disclosure of which is incorporated herein by reference.

BACKGROUND OF THE INVENTION

1. Field of the Invention

The present invention relates to a light emitting diode package and, more particularly, to a light emitting diode package, which efficiently utilize the light emitted from a side of a light emitting diode chip, thereby achieving improved luminance.

2. Description of the Related Art

In general, a light emitting diode (hereinafter, referred to as 'LED') has advantages such as a superior monochromatic peak wavelength, environmental friendliness and suitability for miniaturization, and thus extensively used for various display devices and light sources. A typical LED package has a structure in which an LED is protected by a transparent resin encapsulant. LED devices have various structures but usually the light emitted in sideward directions from the LED, not in the forward direction, accounts for a considerable portion of light.

To utilize the sideward light, a reflective plate with a highly reflective metal film coated thereon is used. A conventional example using such a reflective plate is shown in FIG. 1. Referring to FIG. 1, the LED package 10 includes a package body 11 and an LED chip 15. The package body 11 is composed of a package substrate 11a and a reflective plate 11b, and the LED chip 15 is mounted in an inner space provided by the reflective plate 11b and encapsulated by a resin encapsulant 13. A highly reflective metal film 12 is coated on a surface of the cup-shaped reflective plate 11b so that the light emitted sideward from the LED chip 15 is reflected by the reflective plate 11b to propagate in the emission direction (upward).

In order to obtain good light efficiency, the reflective plate 11b should be installed at an appropriate angle, which requires a sufficient space. However, the LED products used for light sources of mobile phones, etc. lack spaces for installing the reflective plate at an appropriate angle due to the stringent limitation on their thickness. Also, the light loss incurred at the surface of the reflective plate is not negligible.

In order to remedy such problems, there has been suggested using a resin reflective cup with oxidation powder of a high refractive index dispersed therein instead of using the metal-coated reflective plate. FIG. 2 is a side sectional view illustrating such a conventional LED package. Referring to FIG. 2, the LED package 10' includes a package body 11a' and 11b' with oxide powder of a high refractive index such as $TiO_2$ dispersed therein. The package body 11a' and 11b' is composed of a package substrate 11a' and a reflective cup 11b' connected integrally thereto. Due to the oxide ($TiO_2$, etc.) powder of high reflectivity and a high refractive index dispersed in the material of the reflective cup 11b', a portion of the light incident into the reflective cup 11b' (especially, the sideward light) is reflected upward.

However, the conventional LED package is limited in utilization since it does not have a high reflection ratio of the sideward light by the resin reflective cup 11b', incurring a considerable amount of light loss at the resin reflective cup 11' and resulting in a non-uniform reflection. Furthermore, due to the recent trend of miniaturized and slimmer products, the LED package does not satisfy a thickness sufficient for reflecting light, thus incurring a considerable amount of light loss through the surface of the reflecting cup 11b'.

SUMMARY OF THE INVENTION

The present invention has been made to solve the foregoing problems of the prior art and therefore an aspect of the present invention is to provide a high luminance and high efficiency Light Emitting Diode (LED) package which can utilize the light emitted from the side of an LED chip and is advantageous for miniaturization.

According to an aspect of the invention, the invention provides a Light Emitting Diode (LED) package which includes: a package substrate; a light emitting diode chip mounted on the package substrate; an encapsulant formed on the package substrate to encapsulate the light emitting diode chip, wherein the encapsulant has a refractive index gradient with refractive indices continuously increasing from a peripheral surface thereof to a central axis thereof.

According to an embodiment of the present invention, the refractive indices of the encapsulant increase nonlinearly from the peripheral surface thereof to the central axis thereof. For example, the refractive index gradient of the encapsulant may have a parabolic form with respect to a horizontal distance. Also, the refractive index gradient of the encapsulant may have a semicircular form with respect to a horizontal distance.

According to another embodiment of the present invention, the refractive indices of the encapsulant may increase linearly from the peripheral surface thereof to the central axis thereof.

In addition, the encapsulant may be made of a polymer resin or glass.

According to an embodiment of the present invention, the refractive index of the encapsulant may be higher in an upper region thereof than in a lower region thereof. In particular, the refractive indices of the encapsulant may increase continuously from a lower region thereof to an upper region thereof.

According to an embodiment of the present invention, the light emitting diode package may further include a reflecting cup disposed on the package substrate, wherein the light emitting diode chip is mounted on a floor surface of the reflecting cup. In particular, the reflecting cup may have a reflective metal film coated on an inner surface thereof. In addition, the reflecting cup may have oxide powder having a refractive index of at least 2.0 dispersed therein. Further, the oxide powder may include $TiO_2$.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
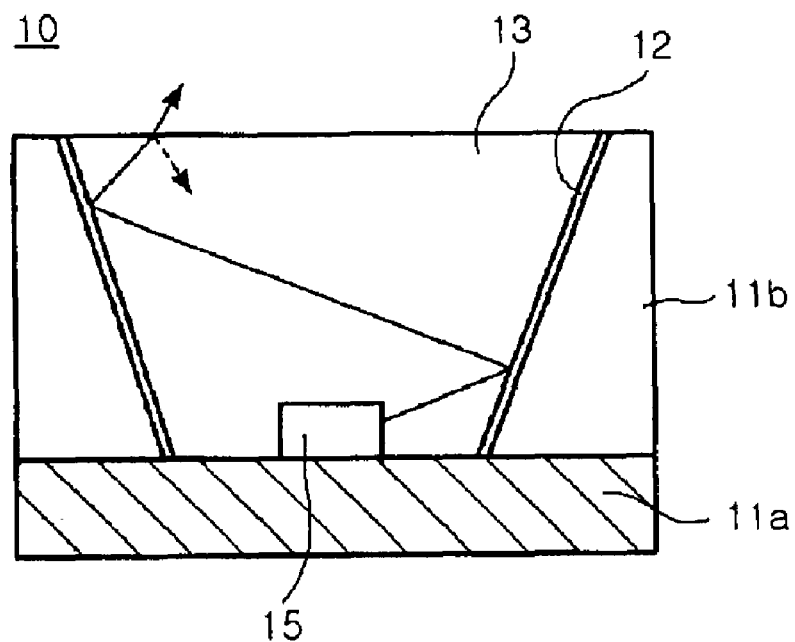
FIG. 1 is a side sectional view illustrating a conventional Light Emitting Diode (LED) package.
Figure 2:
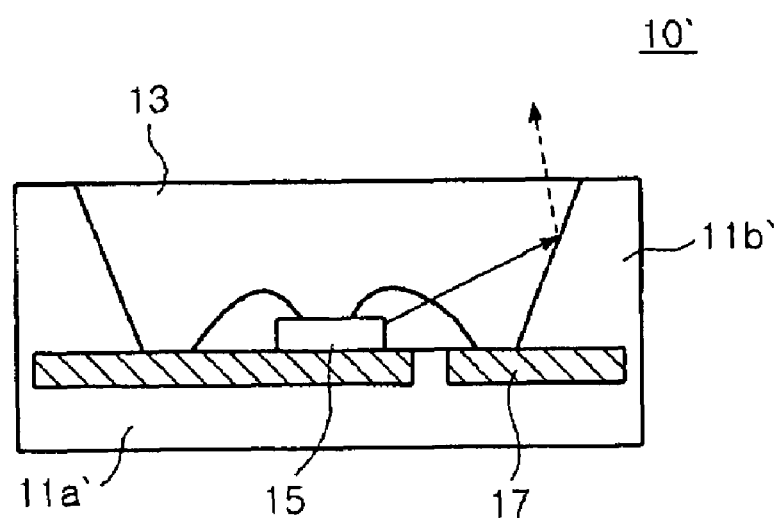
FIG. 2 is a side sectional view illustrating another conventional LED package.

Exemplary embodiments of the present invention will now be described in detail with reference to the accompanying drawings. The invention may however be embodied in many different forms and should into be construed as limited to the embodiments set forth herein. Rather, these embodiments are provided so that this disclosure will be thorough and complete, and will fully convey the scope of the invention to those skilled in the art. In the drawing, the shapes and dimensions are exaggerated for clarity and same reference numerals are used throughout to designate the same or similar components.

Figure 3:
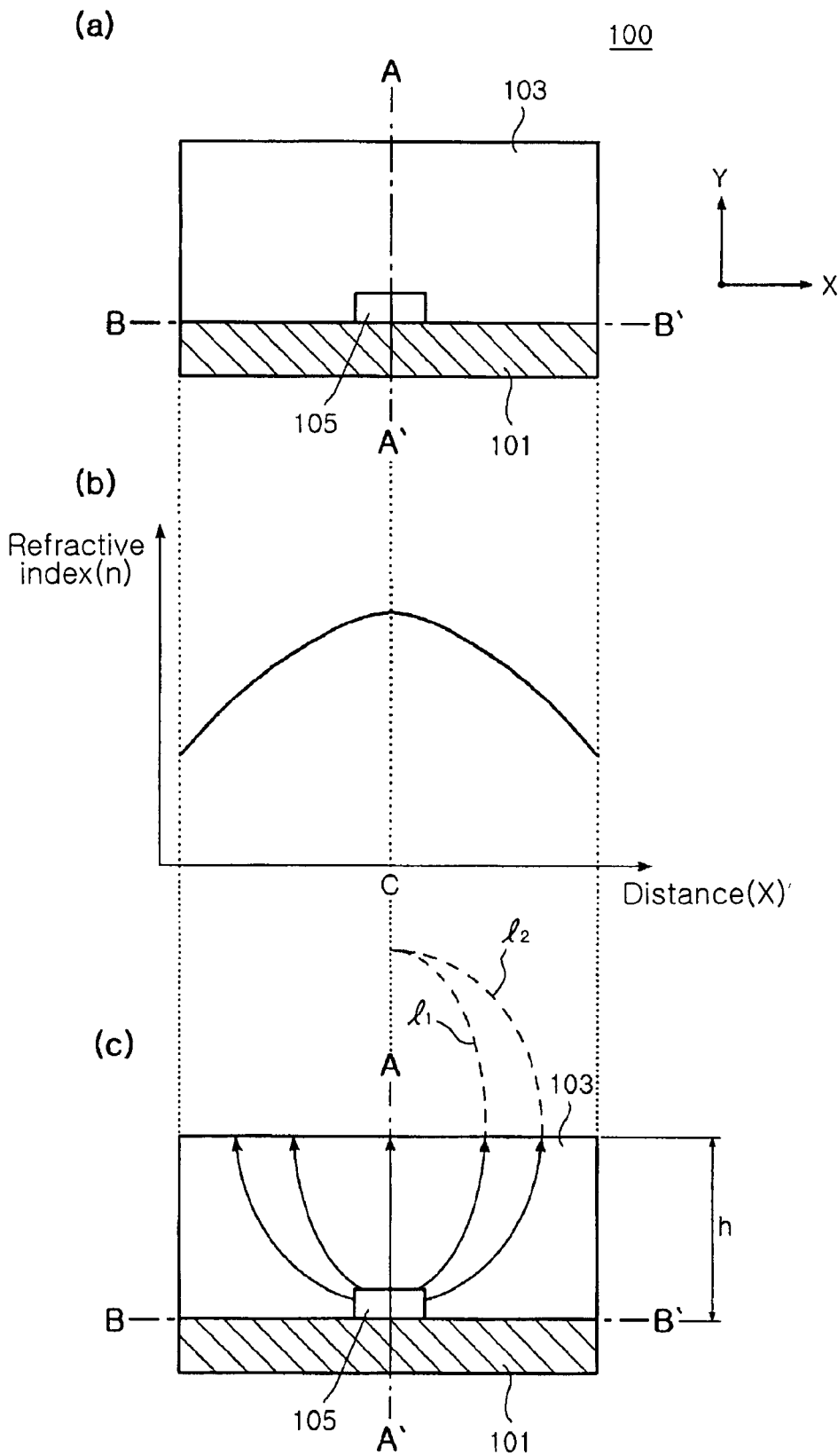
FIG. 3 is a side sectional view illustrating an LED package according to an embodiment of the present invention including a refractive index gradient and light paths of an encapsulant.

FIG. 3 is a view illustrating an LED package according to an embodiment of the present invention in which, FIG. 3(a) is a side sectional view, FIG. 3(b) is a graph showing a refractive index gradient of an encapsulant with respect to a horizontal distance X and FIG. 3(c) illustrates light paths in the encapsulant.

Referring to FIG. 3(a), the LED package 100 includes a package substrate 101 and an LED chip 105 mounted thereon. The LED chip 105 is encapsulated by an encapsulant 103 formed on the package substrate 101. The encapsulant 103 is made of a light-transmitting material such as a transparent resin or glass, and in particular has a refractive index gradient as described later. At this time, the direction in parallel with the length direction B-B' of the package substrate is designated as X direction and the direction in parallel with the axis A-A' perpendicular to the X direction is designated as Y direction. For the sake of convenience, lead frames connecting the LED chip 105 with external terminals are not illustrated.

Referring to FIG. 3(b), the refractive indices of the encapsulant 103 continuously change according to the horizontal distance X. The encapsulant 103 has refractive indices continuously increasing from the peripheral surface to the central axis A-A' of the LED chip 105. That is, the refractive indices n increase toward the central axis C in the graph of refractive index n-horizontal axis X. In particular, the refractive indices n change nonlinearly with respect to the horizontal axis X, and more specifically, has a parabolic profile of refractive index n-horizontal axis X. In this embodiment, there is no refractive index gradient with respect to the height of the encapsulant 103 or the vertical distance Y. That is, the refractive indices do not change with respect to the vertical distance Y of the encapsulant 103.

FIG. 3(c) illustrates a plurality of paths of light (and differences in propagation speed of the light beams) propagating inside the encapsulant with a refractive index gradient as shown in FIG. 3(b). As shown in FIG. 3(c), the light emitted from the LED chip 105 propagates in such a fashion that it is refracted to the side of a higher refractive index and in the light emission direction (upward). Supposing that the encapsulant 103 has a thickness extending beyond the thickness h, the light continues to propagate in a sine wave form beyond the thickness h as shown in FIG. 3(c).

As the propagation speed of the light is in inverse proportion to the refractive index, the light having a short path $l_1$ in the central region and a long path $l_2$ in the peripheral region propagate at the same vertical speed (vertical components of speed). Therefore, the light beams simultaneously emitted from the LED chip in different angles simultaneously arrive at the same vertical distance from the substrate 101.

Therefore, by setting the thickness h of the encapsulant 103 at a specific value, the directivity of the emitted light of the LED package 100 can be maximized with a minimal loss of light. Specifically, since the light (including sideward light) emitted from the light source (LED chip 105) propagates in a sine wave form at the same vertical speed in the medium (the encapsulant 103), the light propagating in the respective paths reach the farthest points away from the central axis A-A' at a particular height h. At this height h, the light has an instantaneous speed of vertical direction, and thus the emission light of the LED package 100 has the maximum vertical directivity at the height h set as the thickness of the encapsulant 103.

However, the light periodically has instantaneous speeds of vertical direction (due to the propagation in the sine wave form), the minimal height of the light propagating in the respective paths, where the light reaches the farthest points away from the central axis A-A', is most preferable in terms of maximizing the directivity of the emission light while minimizing loss of light (see FIG. 3(c)).

The encapsulant 103 having a continuous refractive index gradient as described above can be made with a suitable material through a suitable method. The encapsulant with such a refractive index gradient can be formed with a polymer material including acryl-based resin, polycarbonate-based resin, polystyrene-based resin and perfluoride resin. Using, for example, photocopolymerization, interfacial-gel polymerization, vapor phase transfer, curved mold or immersion, an encapsulant 103 with refractive indices increasing toward the central axis C can be formed.

In addition, the encapsulant 103 can be formed with a glass material. For example, neutron irradiation, chemical vapor deposition or other polymerization methods can be adopted to form the encapsulant 103 with the aforementioned refractive index gradient.

Figure 4:
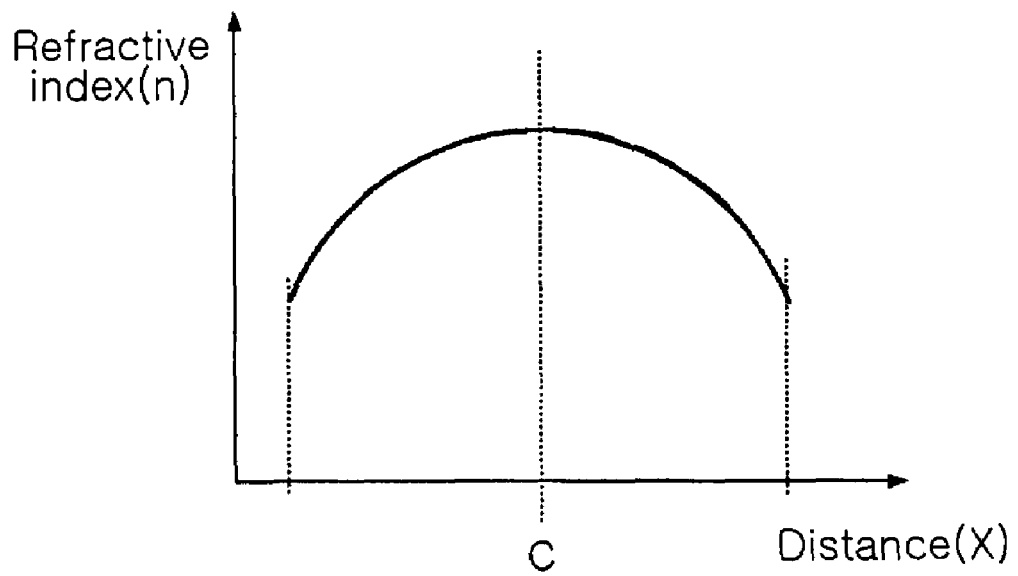
FIG. 4 is a graph illustrating examples of refractive index gradient of the encapsulant according to various embodiments of the present invention.
Figure 4:
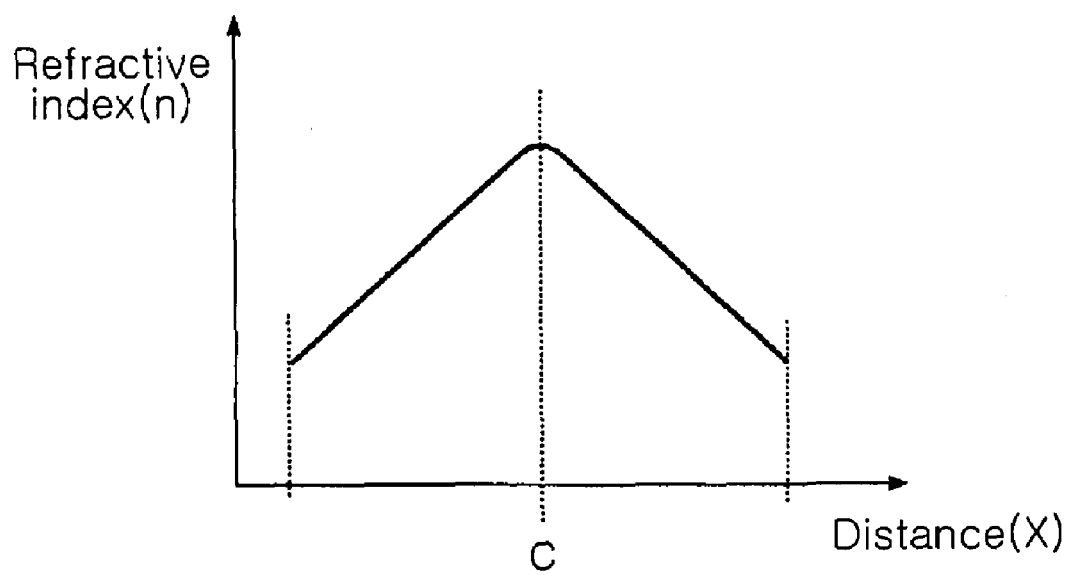

FIG. 4 is a graph illustrating other forms of refractive index gradients of the encapsulant according to embodiments of the present invention. The aforedescribed embodiment (see FIG. 3(b)) exemplifies a parabolic form of refractive index gradient (refractive index n-horizontal distance X profile), but this does not limit the present invention. For example, the encapsulant may have a semicircular refractive index gradient n-X as shown in FIG. 4(a). As just described, the encapsulant may have a nonlinear refractive index gradient n-X such as the parabolic or semicircular form, but also can have a linear refractive index gradient as shown in FIG. 4(b). The encapsulant may further adopt other forms of refractive index gradients. However, as mentioned above, in order to induce the sideward light to the light exiting direction without a separate reflecting cup, the encapsulant preferably has a refractive index gradient increasing continuously toward the central axis A-A'.

Figure 5:
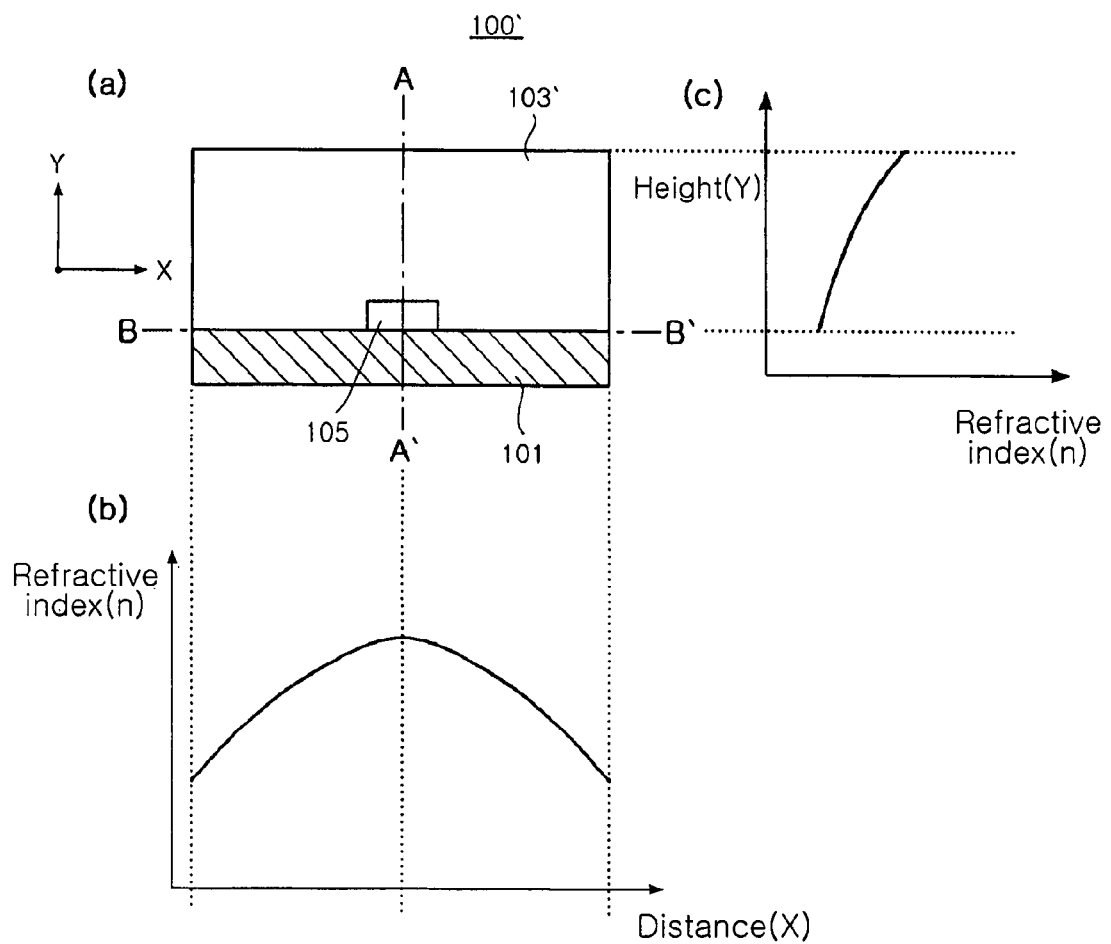
FIG. 5 is a side sectional view illustrating an LED package according to another embodiment of the present invention including the refractive index gradient of the encapsulant.

FIG. 5 is a view illustrating an LED package according to another embodiment of the present invention, in which FIG. 5(a) is a side sectional view, FIG. 5(b) is a graph showing the refractive index gradient of the encapsulant with respect to the horizontal distance X, and FIG. 5(c) is a graph showing the refractive index gradient of the encapsulant with respect to the vertical distance Y.

In the aforedescribed embodiments, the refractive index gradient existed only along the horizontal direction (X direction), but in this embodiment, the refractive indices of the encapsulant also change along the vertical direction (Y direction) as well as the horizontal direction (X direction). That is, as shown in FIG. 5, the refractive indices of the encapsulant 103' increase continuously from the peripheral surface to the central axis A-A' (see FIG. 5(b)), and also increase continuously from a lower region to an upper region (see FIG. 5(c)).

Therefore, as described above, the encapsulant is designed such that the refractive indices increase toward the central axis A-A' and the refractive index is lower in the lower region of the encapsulant 103' than in the upper region of the encapsulant 103'. This allows the light emitted from the LED chip 105 to be bent more precipitously, which enables the LED package 100' with such a refractive index gradient to be applied usefully to a side view type LED package with a narrow width.

Figure 6:
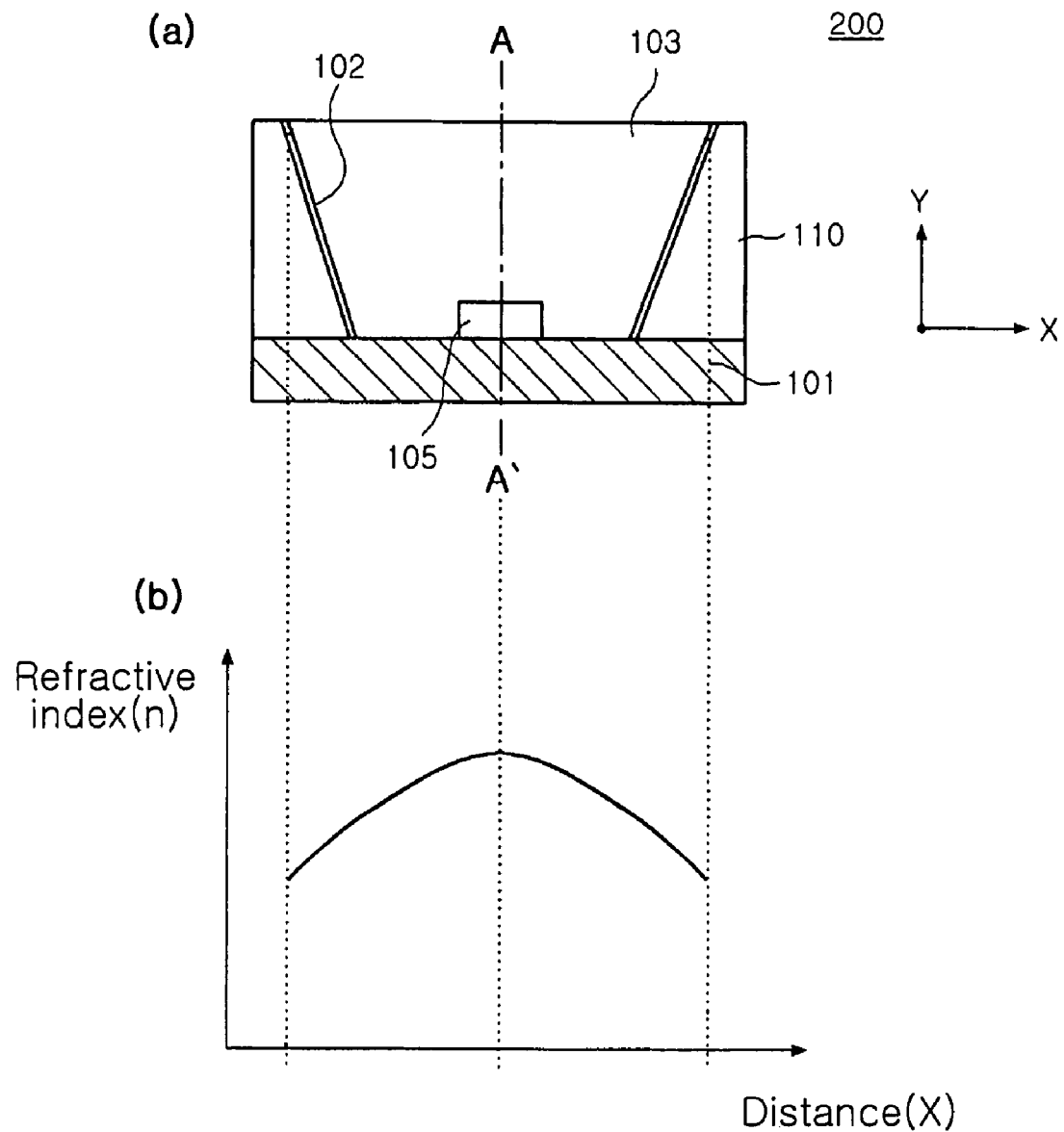
FIG. 6 is a view illustrating an LED package according to another embodiment of the present invention.
Figure 7:
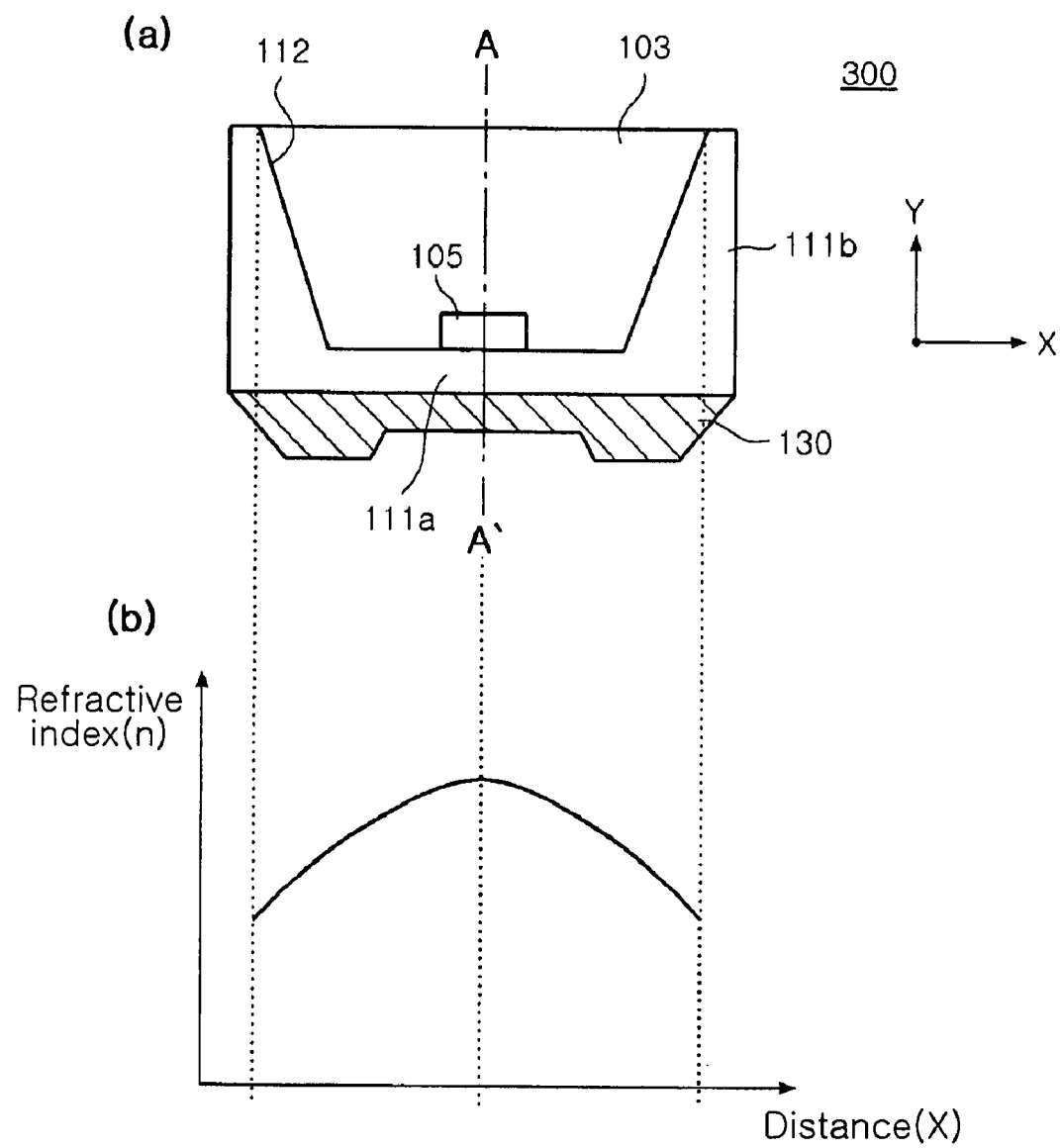
FIG. 7 is a view illustrating an LED package according to further another embodiment of the present invention.

FIGS. 6 and 7 illustrate LED packages according to other embodiments of the present invention. In these embodiments, the LED package 200, 300 further includes a reflecting cup 110, 111b formed on the package substrate 101, 111a. As described above, the present invention allows effective utilization of sideward light without using a separate reflecting cup. However, as shown in FIGS. 6 and 7, the refractive index gradient (see FIG. 6(b) and FIG. 7(b)) can be adopted together with the reflecting cup 110, 111b to more efficiently utilize the sideward light emitted almost horizontally. That is, a narrow width of the encapsulant 103 hinders bending the sideward light, which is emitted horizontally, in an upward direction, but additionally providing a separate reflecting cup 110, 111b enables more effective reflection of the sideward light.

Referring to FIG. 6, the reflecting cup 110 is mounted on the package substrate 101 as a separate member. The reflecting cup 110 is a substrate with a hole formed therein, and thus can be referred to as a reflecting plate. The LED chip 105 is mounted on a floor surface of the reflecting cup 110. In order to enhance the reflecting effect by the reflecting cup 110, the reflecting cup 110 has a highly reflective metal film 102 such as Ag, Al, etc. coated on an inner surface thereof.

Referring to FIG. 7, the package substrate 111a has the reflecting cup 111b formed thereon and integrally connected thereto. The substrate 111a and the reflecting cup 111b can be formed integrally with a lead frame (not shown) by injection molding, etc. In order to obtain a light reflecting effect by the inner surface 112 of the reflecting cup 111b, the reflecting cup 111b has oxide powder of a high reflective index of at least 2.0 such as $TiO_2$ dispersed therein. In order to effectively discharge heat, a heat sink 130 made of metal or ceramics can be installed under the package substrate 111a.

According to the present invention set forth above, an encapsulant can have refracting indices continuously increasing toward a central axis, thereby efficiently utilizing sideward light using refraction characteristics without a separate reflecting cup. This further improves the light emission efficiency and luminance of an LED package and facilitates miniaturization and slimming of a product.

While the present invention has been shown and described in connection with the exemplary embodiments, it will be apparent to those skilled in the art that modifications and variations can be made without departing from the spirit and scope of the invention as defined by the appended claims.

What is claimed is:

1. A light emitting diode package comprising:
a package substrate;
a light emitting diode chip mounted on the package substrate;
an encapsulant formed on the package substrate to encapsulate the light emitting diode chip,
wherein the encapsulant has a refractive index gradient with refractive indices continuously increasing from a peripheral surface thereof to a central axis thereof.

2. The light emitting diode package according to claim 1, wherein the refractive indices of the encapsulant increase nonlinearly from the peripheral surface thereof to the central axis thereof.

3. The light emitting diode package according to claim 2, wherein the refractive index gradient of the encapsulant has a parabolic form with respect to a horizontal distance.

4. The light emitting diode package according to claim 2, wherein the refractive index gradient of the encapsulant has a semicircular form with respect to a horizontal distance.

5. The light emitting diode package according to claim 1, wherein the refractive indices of the encapsulant increase linearly from the peripheral surface thereof to the central axis thereof.

6. The light emitting diode package according to claim 1, wherein the encapsulant comprises a polymer resin.

7. The light emitting diode package according to claim 1, wherein the encapsulant comprises glass.

8. The light emitting diode package according to claim 1, wherein the refractive index of the encapsulant is higher in an upper region thereof than in a lower region thereof.

9. The light emitting diode package according to claim 8, wherein the refractive indices of the encapsulant increase continuously from a lower region thereof to an upper region thereof.

10. The light emitting diode package according to claim 1, further comprising a reflecting cup disposed on the package substrate, wherein the light emitting diode chip is mounted on a floor surface of the reflecting cup.

11. The light emitting diode package according to claim 10, wherein the reflecting cup has a reflective metal film coated on an inner surface thereof.

12. The light emitting didoe package according to claim 10, wherein the reflecting cup has oxide powder having a refractive index of at least 2.0 dispersed therein.

13. The light emitting diode package according to claim 12, wherein the oxide powder comprises $TiO_2$.

* * * * *